United States Patent
Chu et al.

(10) Patent No.: US 8,912,605 B1
(45) Date of Patent: *Dec. 16, 2014

(54) ESD PROTECTION CIRCUIT

(75) Inventors: Charles Y. Chu, Cupertino, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/538,508

(22) Filed: Jun. 29, 2012

Related U.S. Application Data

(63) Continuation of application No. 12/833,864, filed on Jul. 9, 2010, now Pat. No. 8,217,461.

(51) Int. Cl.
*H01L 23/62* (2006.01)

(52) U.S. Cl.
USPC .......................................................... 257/355

(58) Field of Classification Search
USPC .................. 257/213–413, 900, 902–903, 257/E21.19–E21.21, E21.394–E21.458, 257/E21.615–E21.694, E29.049–E29.067, 257/E29.237, E29.256–E29.266, E29.299, 257/151–153, E21.575–E21.579, 54, 73, 257/155, 156, 449–457, 928, E51.009, 257/E33.051, E33.065–E33.066, 257/E31.074–E31.075, E27.04, E27.068, 257/E29.013, E29.041, E29.148–E29.149, 257/E29.178, E29.271, E29.311, E29.317, 257/E21.047, E21.064, E21.163, E21.173, 257/E21.186; 438/135, 142, 92, 167–185, 438/534, 570–583
See application file for complete search history.

(56) References Cited

U.S. PATENT DOCUMENTS

| | | | | |
|---|---|---|---|---|
| 5,825,600 | A * | 10/1998 | Watt | 361/56 |
| 7,511,932 | B1 * | 3/2009 | Gallerano et al. | 361/56 |
| 8,217,461 | B1 * | 7/2012 | Chu et al. | 257/355 |

\* cited by examiner

*Primary Examiner* — Dao H Nguyen
*Assistant Examiner* — Tram H Nguyen
(74) *Attorney, Agent, or Firm* — Ward & Zinna, LLC

(57) ABSTRACT

A multi-fingered gate transistor formed in a substrate of one conductivity type overlying a well of a second conductivity type. Ohmic contact to the well is made by an implanted region of the second conductivity type that circumscribes the gate transistor. Ohmic contact to the substrate is made by taps located on sides of the gate structure between the gate structure and the well contact. Floating wells are located on opposite sides of the gate structure between the substrate taps and the ends of the gates to isolate these substrate taps and force current flow in the substrate under the gate transistor to be substantially perpendicular to the direction in which the gate fingers extend. This increases the potential difference between these substrate regions and source regions in the gate transistor, thereby aiding the triggering of the parasitic bipolar transistors under adjacent gate fingers into a high current state.

18 Claims, 8 Drawing Sheets

ESD PROTECTION CIRCUIT

BACKGROUND OF THE INVENTION

This relates to electrostatic discharge (ESD) protection devices for protecting an integrated circuit from ESD damage.

BACKGROUND OF THE INVENTION

N-type metal-oxide-silicon (NMOS) transistors such as transistor 100 of FIG. 1 are a frequent choice for ESD protection circuits for integrated circuits. Transistor 100 comprises N-type source and drain regions 110, 120 in a P-type well 130 in substrate 140, an insulating layer 150 on the substrate and a gate 160 on the insulating layer between the source and drain regions. Sidewall spacers 162 are located on each side of gate 160; and lightly doped drain (LDD) regions 170, 180 extend part way under the gate from the source and drain regions. Transistor 100 operates to provide ESD protection by triggering a parasitic lateral bipolar transistor 190 inherent in the MOS structure where the source and drain regions 110, 120 of the MOS transistor constitute the emitter and collector of the lateral bipolar transistor and the well 130 constitutes the base. See, for example, A. Amerasekera et al., *ESD in Silicon Integrated Circuits*, pp. 81-95 (2d Ed., Wiley, 2002), which is incorporated herein by reference.

In an integrated circuit (IC), a typical implementation of a MOS transistor is as a multi-fingered gate structure 200 such as that shown in a top view in FIG. 2A and in cross-section in FIG. 2B taken along line B-B of FIG. 2A. For convenience, only four of the fingers of the device of FIG. 2A have been shown in FIG. 2B. Structure 200 comprises N-type source and drain regions 210, 220 in a P-type substrate 230 over a deep N-type well 240, an insulating layer 250 on the substrate and a multi-fingered gate 260 on the insulating layer. LDD regions 270, 280 extend part way under each gate finger. As depicted schematically in FIG. 2A, the source regions 210 are connected together by a connector 215 that is typically formed in a metallization layer on the IC; the drain regions 220 are connected together by a connector 225 also formed in a metallization layer on the IC; and the gate fingers are connected together by a connector 265 also formed in a metallization layer on the IC. As a result, the source regions, the drain regions and the gate fingers are each connected in parallel. The dimension L is the gate length; the dimension W is the width of a gate finger. Since the source regions, the drain regions and the gate fingers are connected in parallel, the total gate width of the transistor is the product of W and the number of fingers, or 8W for the device shown in FIG. 2A.

Structure 200 further includes a N-type implant region 290 that circumscribes multi-fingered gate structure 200 on the periphery of the structure; an N-type contact (or tap) 292; and a P-type contact (or tap) 232 located between the gate fingers and the N-type tap 292. N-type tap 292 makes ohmic contact to N-type well 240 through N-type implant region 290; and P-type tap 232 makes ohmic contact to P-type substrate 230.

In an ESD protection circuit, the P-type tap 232 is formed on all four sides of the multi-fingered transistor as shown in FIG. 2A. However, there is considerable variation in distance between the P-type tap 232 and the different portions of the gate fingers of the multi-fingered transistor. As a result, the electric potential of the substrate under the different gate fingers varies along the different fingers. Since the triggering of the parasitic bipolar transistor depends on forward biasing the P-N junction between the P-type substrate and the N-type source region, the potential difference at some portions of the multi-fingered structure between the substrate and the adjacent source regions may not be enough to trigger the parasitic transistor in those portions. Thus, triggering of the transistor tends to be non-uniform with the result that the transistor is not able to discharge as large an ESD pulse as it could if triggering were substantially uniform across the entire multi-fingered structure.

Conventional efforts to increase the potential difference between the substrate and the source under the gate fingers usually involve increasing the distance between these regions and the P-type tap. The penalty for this, however, is that there is a substantial gap 235 between the gate fingers and the P-type substrate tap resulting in an increase in the size of the transistor.

SUMMARY OF THE PRESENT INVENTION

Our invention is practiced in a multi-fingered gate transistor that is formed in a substrate of one conductivity type overlying a well of a second conductivity type. Ohmic contact to the well is made by an implanted region of the second conductivity type that surrounds the multi-fingered gate transistor and connects to the well and by a tap in the implanted region. Ohmic contact to the substrate is made by four elongated taps located on four sides of the multi-fingered gate structure between the gate structure and the well contact.

In an illustrative embodiment of the invention, elongated floating wells are located on opposite sides of the gate structure between two of the substrate taps and the ends of the gates. Thus, the floating wells extend in a direction substantially perpendicular to the direction in which the gate fingers extend. As a result, the floating wells effectively isolate these two substrate taps and force current flow in the substrate under the multifingered gate transistor to be substantially perpendicular to the direction in which the gate fingers extend. This increases the potential difference between these substrate regions and adjacent source regions in the multi-fingered gate transistor, thereby aiding the triggering of the parasitic bipolar transistors under adjacent gate fingers into a high current state. This also reduces the differences among the potentials in the substrate under the different source regions and thus improves the uniformity of turn-on of the parasitic bipolar transistors under the gate fingers. Because the floating wells effectively isolate two of the substrate taps, it is not necessary to maintain as great a distance from them as in prior art devices. Moreover, because the floating wells significantly improve the performance of the ESD protection structure, some of this performance improvement may be exchanged for decreases in the size of the protection structure.

A process for forming this structure is a further aspect of the invention. In particular, the floating wells are formed during the well-implant process.

BRIEF DESCRIPTION OF THE DRAWINGS

These and other objects, features and advantages will be more readily apparent from the following Detailed Description in which.

DETAILED DESCRIPTION

Figure 1:
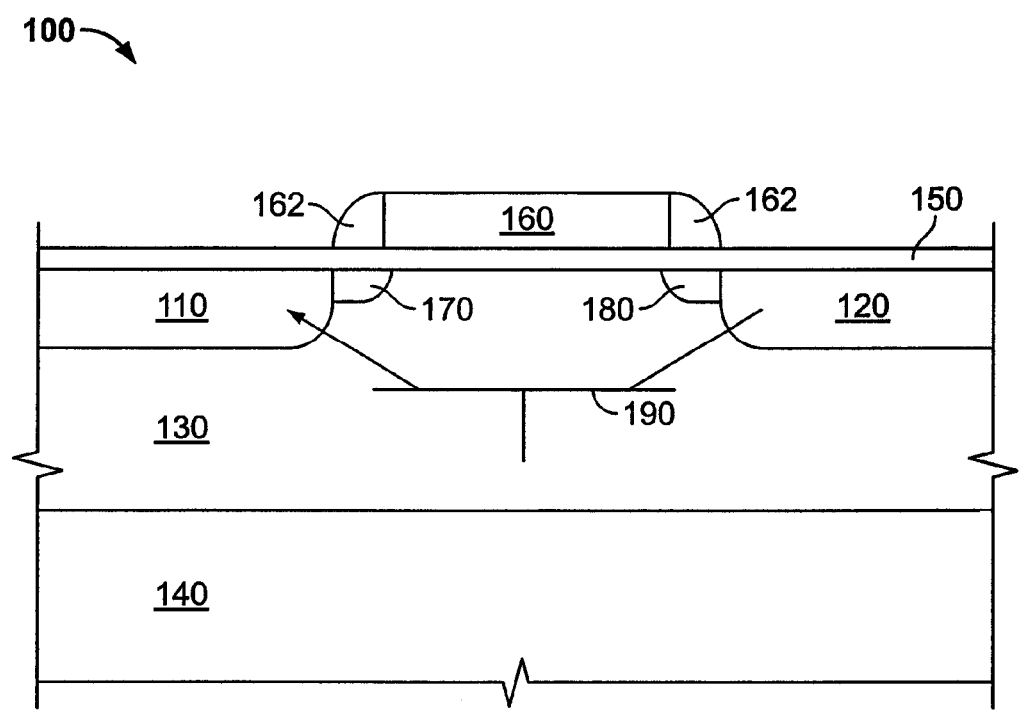
FIG. 1 is a schematic representation of a prior art NMOS transistor.
Figure 2A:
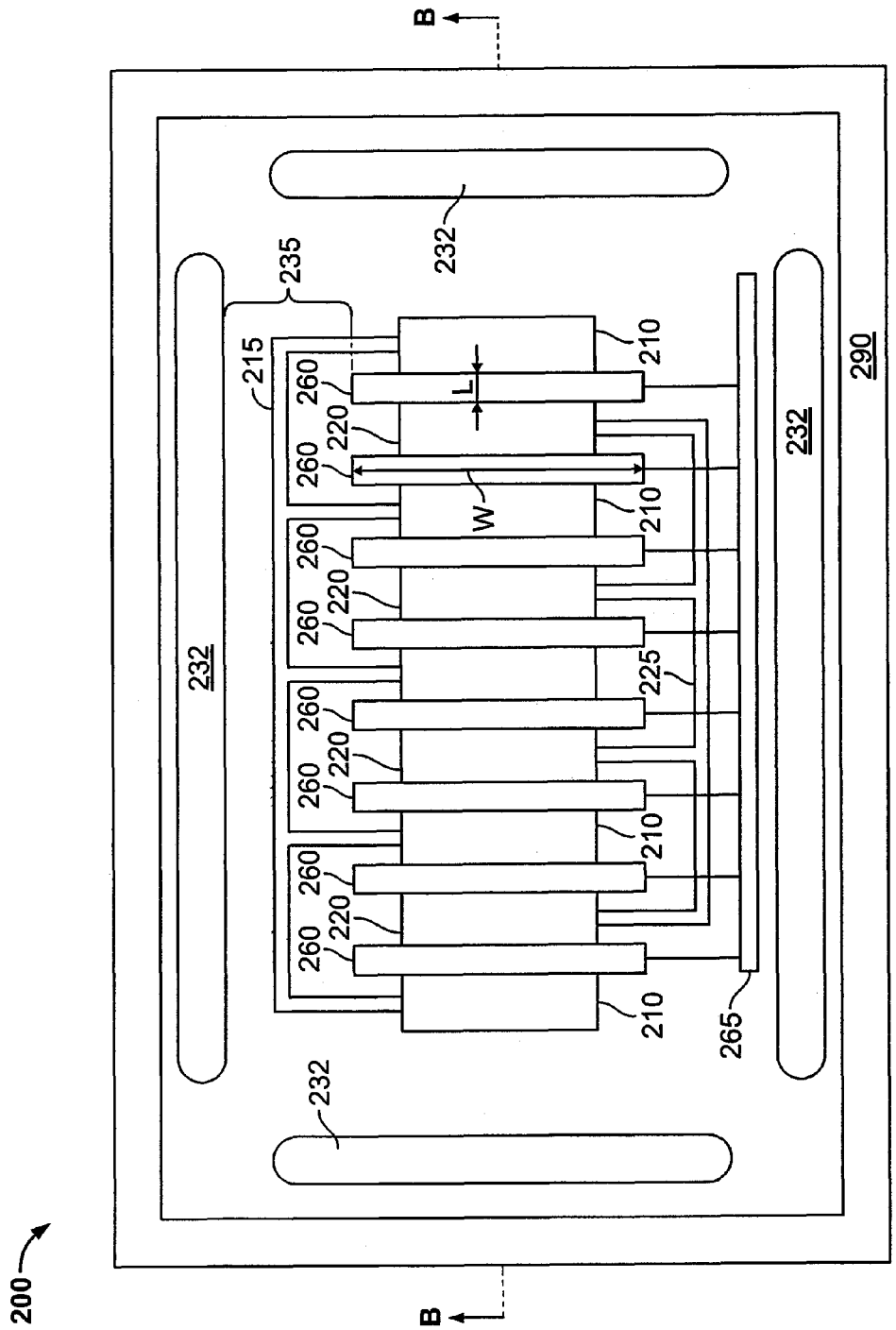
FIGS. 2A and 2B are a top view and a cross-sectional view of a prior art multi-fingered gate transistor.
Figure 2B:
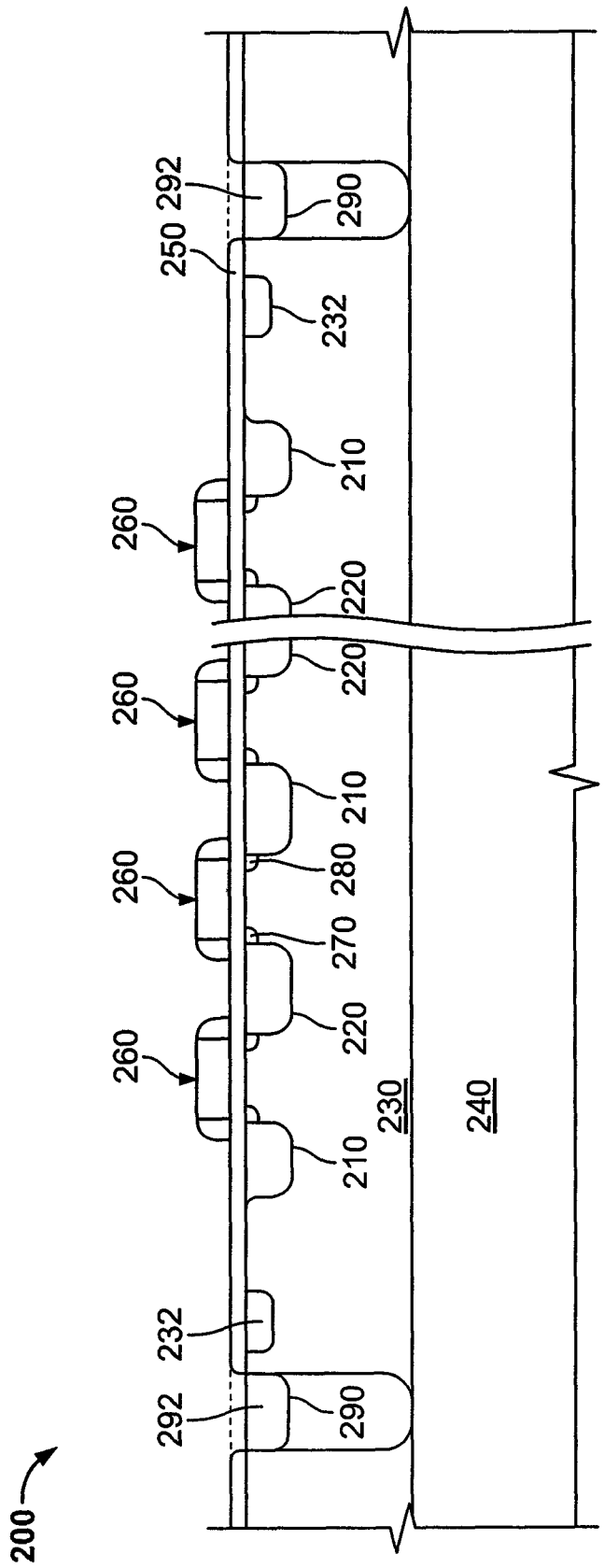
Figure 3A:
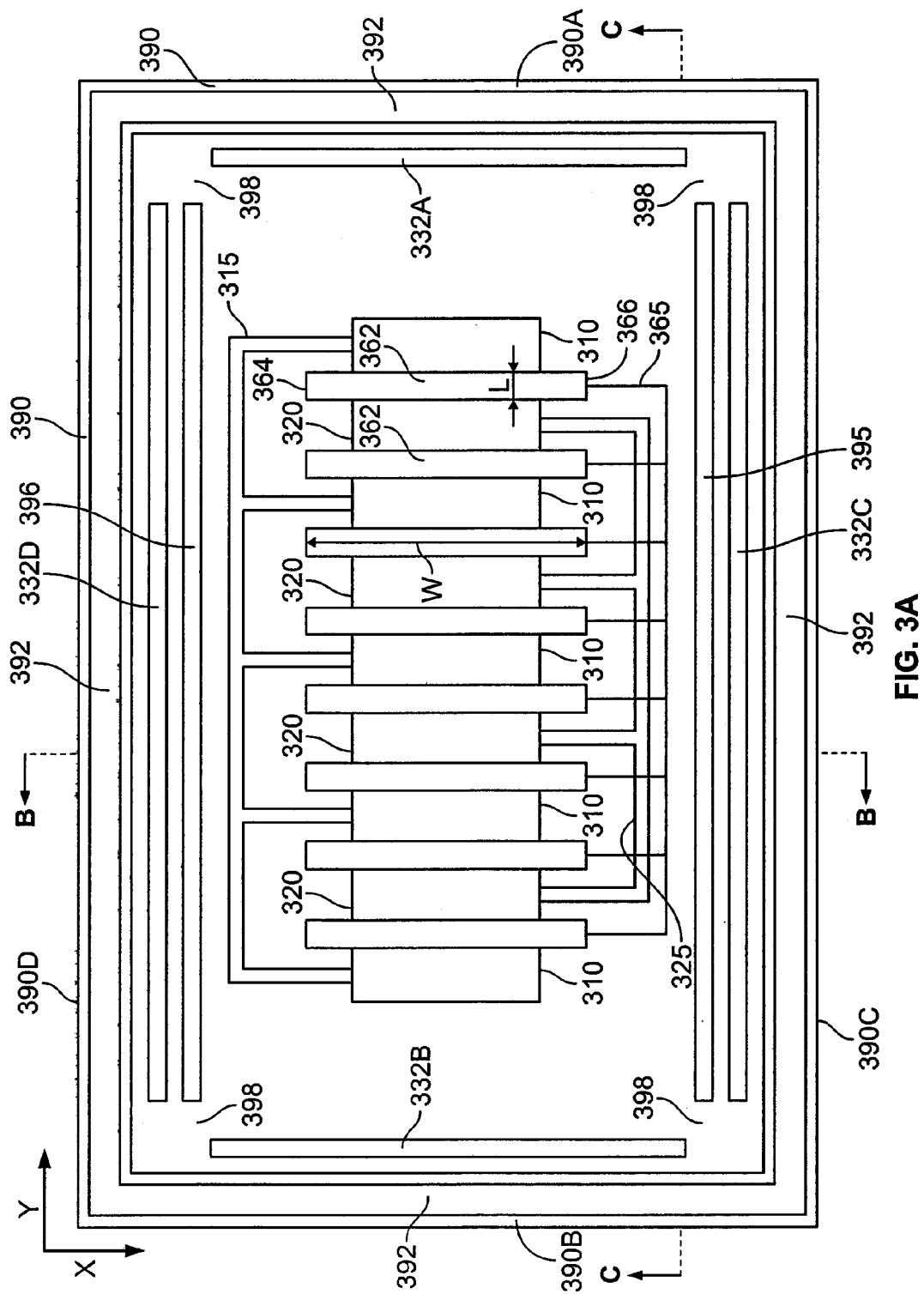
FIGS. 3A, 3B and 3C are a top view and cross-sectional views of an illustrative multi-fingered gate transistor of the present invention.
Figure 3B:
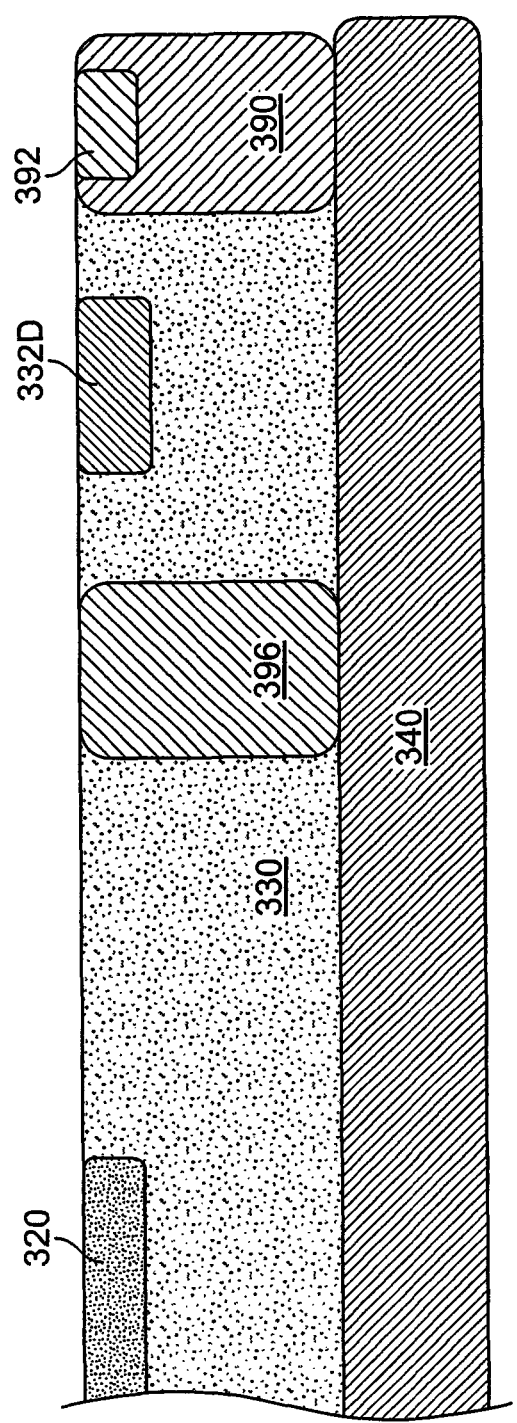
Figure 3C:
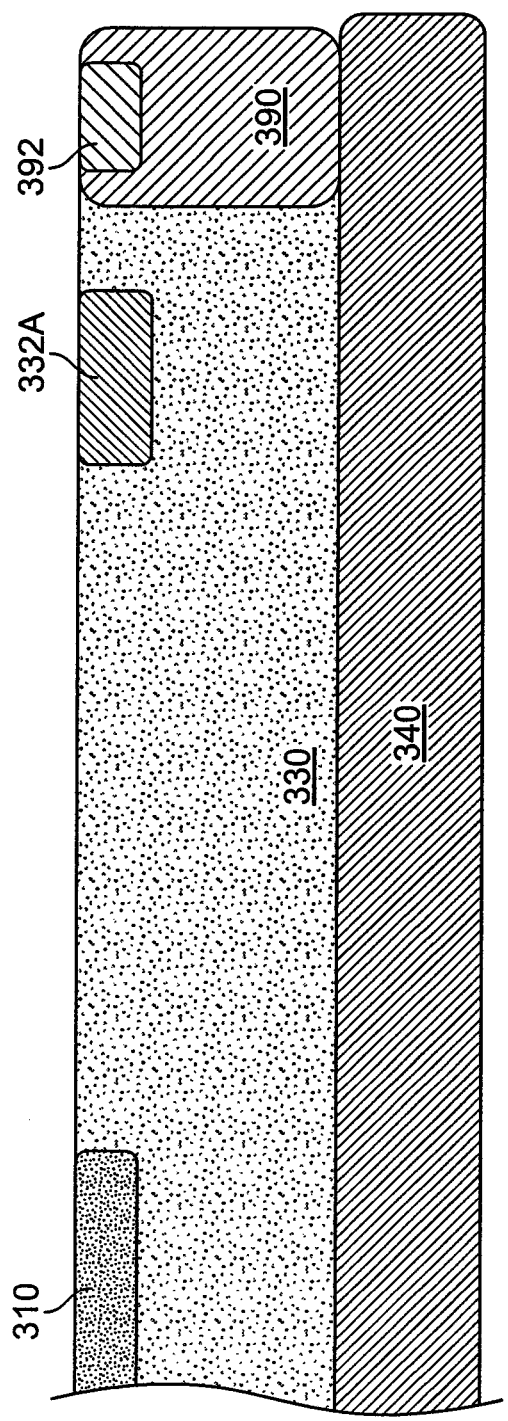

In accordance with one aspect of the invention, we have modified the structure of a multi-fingered MOS transistor so as to insert a floating well between the substrate tap and the gate fingers. FIGS. 3A, 3B and 3C depict a top view and two cross-sectional views of a multi-fingered gate structure 300 formed in accordance with this aspect of the invention. The cross-section of FIG. 3B is taken along the right-hand side of line B-B of FIG. 3A; and the cross-section of FIG. 3C is taken along the right-hand side of line C-C of FIG. 3A. Structure 300 comprises N-type source and drain regions 310, 320 in a first P-type substrate 330 above a deep N-type well 340, an insulating layer (not shown) on the substrate and a multi-fingered gate 360 on the insulating layer. As shown in FIG. 3A, gate fingers 362 are parallel to one another, extend in a first direction X, and have first and second ends 364, 366. LDD regions (not shown) extend part way under each gate finger. As shown schematically in FIG. 3A, the source regions 310 are connected together by a connector 315 that is typically formed in a metallization layer on the IC; the drain regions 320 are connected together by a connector 325 also formed in a metallization layer on the IC; and the gate fingers 360 are connected together by a connector 365 also formed in a metallization layer on the IC. As a result, the source regions, the drain regions and the gate fingers are each connected in parallel. Again, the dimension L is the gate length; and the dimension W is the width of a gate finger. Since the source regions, the drain regions and the fingers are connected in parallel, the total gate width of the transistor shown in FIG. 3A is 8W.

Structure 300 further includes an N-type implant region 390 that circumscribes the multi-fingered gate structure and connects to the N-type well 340 all along the periphery of the N-well as shown in the cross-sections of FIGS. 3B and 3C. N-type region 390 is substantially rectangular in shape with first and second sides 390A, 390B having a width that extends in a first direction X and third and fourth sides 390C, 390D having a length that extends in a second direction Y perpendicular to the first direction.

Structure 300 further includes an N-type contact (or tap) 392 to N-type implanted region 390 and P-type contacts (or taps) 332A, 332B, 332C, 332D to P-type substrate 330. As shown in FIG. 3A, N-type contact 392 extends substantially around the entire circumference of region 390. As also shown in FIG. 3A, P-type contacts 332A, 332B, 332C, 332D are located adjacent all four sides 390A, 390B, 390C, 390D of implanted region 390.

Structure 300 also includes first and second implanted N-type floating wells 395, 396 that are located in the substrate between substrate taps 332C and 332D and the ends of the gate fingers. As shown in FIG. 3A, the floating wells extend in the second direction Y and are substantially parallel to the third and fourth sides of region 390 while being shorter than the length of the third and fourth sides. As shown in FIG. 3B, the floating wells connect with n-type well 340 directly underneath them; and this connection to the n-type well extends for the full length of each floating well 395, 396. As shown in FIG. 3A, the floating wells 395, 396 do not connect with the first and second sides 390A, 390B of region 390, leaving a gap 398 at each end. As the name suggests, there is no contact to the floating wells.

The floating wells effectively isolate substrate taps 332C and 332D and force current flow in the substrate under the multifingered gate transistor to be substantially perpendicular to the X direction in which the gate fingers extend. This increases the potential difference between these substrate regions and adjacent source regions in the multi-fingered gate transistor, thereby aiding the triggering of the parasitic bipolar transistors under adjacent gate fingers into a high current state. This also reduces the differences among the potentials in the substrate under the different source regions and thus improves the uniformity of turn-on of the parasitic bipolar transistors under the gate fingers. Because the floating wells effectively isolate substrate taps 332C, 332D, it is not necessary to maintain as great a distance from those substrate taps as in prior art devices. Moreover, because the floating wells significantly improve the performance of the ESD protection structure, some of this performance improvement may be exchanged for decreases in the size of the protection structure.

Figure 4:
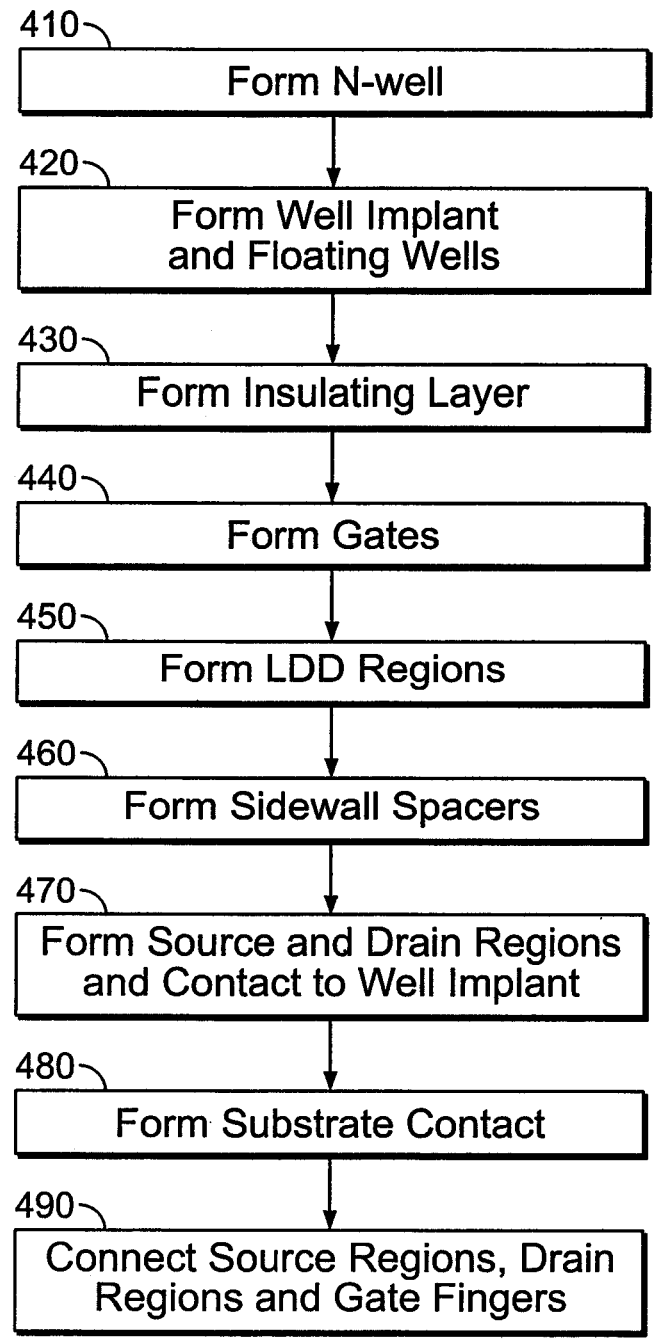
FIG. 4 is a flow chart detailing an illustrative process for making the transistor of FIGS. 3A-3C.

A flowchart detailing an illustrative process for forming structure 300 is set forth in FIG. 4. The starting material is a P-type substrate. At step 410, N-type dopants are implanted in to the P-type substrate in sufficient quantity and at sufficient energy to form N-type well 340. At step 420, N-type dopants are implanted into the substrate to form implant region 390 and floating wells 395, 396. Both implant region 390 and floating wells 395, 396 are implanted so that they extend from the surface of substrate 330 to the deep N-well 340. As described above in conjunction with FIGS. 3A-3C, implant region 390 circumscribes the area of the substrate where the multi-fingered transistor is to be formed. Floating wells 395, 396 divide this area into three subareas, a central one of which is used for the transistor and the other two of which are used for the substrate contacts 332.

An insulating layer such as silicon dioxide is then formed on the surface of the substrate at step 430 and the multi-fingered gates are formed at step 440 using conventional lithographic processes. Next, at step 450 a lightly doped region is formed on either side of each gate finger using the gate fingers as a mask. Sidewall spacers are then formed at step 460 using conventional oxidation and etching techniques. At step 470 N-type source and drain regions are formed using the gate fingers and sidewall spacers as masks. Illustratively, in current technologies, source and drain regions are about 0.1 micron deep. At the same time that the source and drain regions are formed, an N-type contact (or tap) 392 is formed in implant region 390. At step 480, a P-type contact (or tap) 332 is formed to substrate 330. At step 490, the source regions are connected together; the drain regions are connected together; and the gate fingers are connected together.

In the illustrative embodiment described above, dopant concentrations in the P-type substrate 330, the N-type well 340, the implant region 390, and the floating wells 395, 396 is in the range of $10^{16}$ to $10^{18}$ dopants/cm$^3$. Dopant concentrations in the source and drain regions 310, 320 and in the taps 332 and 392 is in the range of $10^{18}$ to $10^{20}$ dopants/cm$^3$.

Other processes not relevant to this invention may be performed before, during or after the processes described herein either on the same portions of the substrate or on different portions. For example, N-type wells, gate structures and source and drain regions advantageously are formed on other portions of the substrate at the same time as such structures are formed according to the steps of FIG. 4 and interconnections will be formed to other structures at the same time as they are formed to the structures of the present invention.

Figure 5:
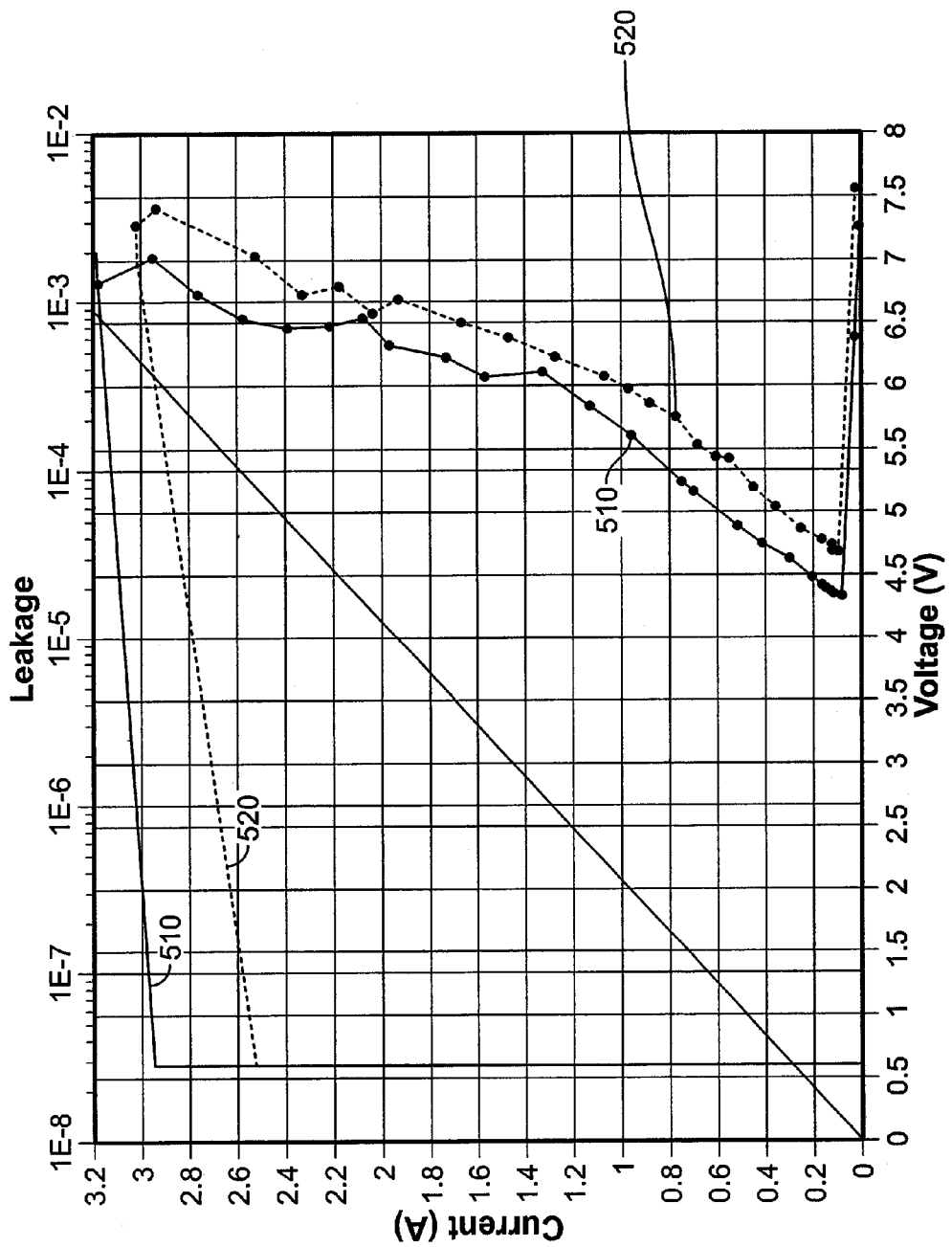
FIG. 5 is a plot illustrating the performance of the transistor of the present invention. The drawings are schematic and are not drawn to scale.

FIG. 5 is a plot of current vs. voltage (IV) observed during transmission line pulsing that demonstrates the advantages of an ESD protection structure that uses floating wells of the type described above compared with a similar prior art device that does not use floating wells. Plot 510 indicates the performance of the prior art device; and plot 520 the performance of a device that uses floating wells. On the bottom righthand side of the plot is the measurement of the triggering voltage, Vt1. This measurement is approximately 7.3 Volts for the floating well device and approximately 7.6 Volts for the prior art device. These measurement were made at DC with no capacitance in the test circuit. It is estimated from these results that the triggering voltage would be approximately 8.3 V for the floating well device and approximately 8.7 volts for the prior art device if measured in a circuit with significant capacitance. The righthand side of the plot also provides the snapback voltage, Vholding, which is the minimum voltage. Again, this voltage for the floating well device is less than the prior art device: approximately 4.3 Volts for the floating well device and approximately 4.7 Volts for the prior art device. Further, the IV curve 520 for the floating well device remains to the left of the curve 510 for the prior art device. On the left-hand side of the plot the data indicates the current at which the ESD device begins to fail. As indicated, the prior art device begins to fail at about 2.5 Amps; but the device that includes floating wells begins to fail at about 2.95 Amps.

Numerous variations will be apparent to those skilled in the art. In some applications, substitution of P-type dopants for N-type dopants and vice versa may prove advantageous.

What is claimed is:

1. An electrostatic discharge (ESD) protection structure comprising:
    a substrate having a first conductivity type;
    a MOS transistor comprising a plurality of gate fingers on the substrate and source and drain regions formed in the substrate between the gate fingers, the gate fingers extending in a first direction and having first and second ends;
    a deep well underneath the MOS transistor, the deep well having a second conductivity type;
    a first ohmic contact to the deep well;
    a second ohmic contact to the substrate, the second ohmic contact being located between the first ends of the gate fingers and the first ohmic contact; and
    a floating well located between the second ohmic contact and the first ends of the gate fingers, the floating well having the second conductivity type.

2. The ESD protection structure of claim 1 wherein the first conductivity type is P-type and the second conductivity type is N-type.

3. The ESD protection structure of claim 1 wherein the floating well extends through the substrate to contact the deep well.

4. The ESD protection structure of claim 1 wherein the floating well has first and second ends and there are gaps between the first and second ends of the floating well and the first ohmic contact.

5. The ESD protection structure of claim 1 wherein the floating well has a length in a second direction that is less than a length of the first ohmic contact in the second direction.

6. The ESD protection structure of claim 1 wherein there is no surface contact to the floating well.

7. The ESD protection structure of claim 1 wherein the first ohmic contact and each floating well are implants having the same conductivity type.

8. The ESD protection structure of claim 1 further comprising;
    a third ohmic contact to the substrate, the third ohmic contact being located between the second ends of the gate fingers and a second side of the first ohmic contact; and
    a second floating well located between the third ohmic contact and the second ends of the gate fingers, the second floating well having the second conductivity type.

9. The ESD protection structure of claim 1 wherein the gate fingers are substantially parallel to one another.

10. An electrostatic discharge (ESD) protection structure comprising:
    a substrate having a first conductivity type;
    a MOS transistor comprising a plurality of gate fingers having first and second ends, the gate fingers being substantially parallel to one another and extending in a first direction on the substrate and source and drain regions formed in the substrate between the gate fingers, the source and drain regions having a second conductivity type;
    a deep well underneath the MOS transistor, the deep well having a second conductivity type;
    a first ohmic contact to the deep well;
    a second ohmic contact to the substrate, the second ohmic contact extending in a second direction substantially perpendicular to the first direction and located between the first ends of the gate fingers and the contact to the deep well; and
    a floating well extending in the second direction and located between the second ohmic contact and the first ends of the gate fingers, the floating well having the second conductivity type.

11. The ESD protection structure of claim 10 wherein the first conductivity type is P-type and the second conductivity type is N-type.

12. The ESD protection structure of claim 10 wherein the floating well extends through the substrate to contact the deep well.

13. The ESD protection structure of claim 10 wherein each floating well has first and second ends and there are gaps between the first and second ends of each floating well and the first ohmic contact.

14. The ESD protection structure of claim 10 wherein there is no surface contact to the floating well.

15. The ESD protection structure of claim 10 wherein the first ohmic contact and the floating well are implants having the same conductivity type.

16. The ESD protection structure of claim 10 further comprising;
    a third ohmic contact to the substrate, the third ohmic contact and being located between the second ends of the gate fingers and a second side of the first ohmic contact; and
    a second floating well located between the third ohmic contact and the second ends of the gate fingers, the second floating well having the second conductivity type.

17. A method for forming an electrostatic discharge (ESD) protection structure comprising:
    implanting in a substrate of a first conductivity type dopants of a second conductivity type to form a deep well in a first area of the substrate;
    implanting in the substrate dopants of the second conductivity type to form both a first region extending into the substrate to the deep well and a second elongated region that extends into the substrate to the deep well, thereby dividing the first area into first and second subareas;

forming a contact to the substrate in the first subarea between the first region and the second elongated region;
forming an insulating layer on the substrate;
forming a plurality of gate fingers on the insulating layer within the second subarea; and
forming source and drain regions in the substrate between the gate fingers.

18. The method of claim 17 further comprising the step of forming a contact to the first region.

* * * * *